United States Patent
Choi et al.

(10) Patent No.: US 8,263,435 B2
(45) Date of Patent: Sep. 11, 2012

(54) SEMICONDUCTOR DEVICE AND METHOD OF STACKING SEMICONDUCTOR DIE IN MOLD LASER PACKAGE INTERCONNECTED BY BUMPS AND CONDUCTIVE VIAS

(75) Inventors: DaeSik Choi, Seoul (KR); WonJun Ko, Kyungki-Do (KR); JaEun Yun, Kyounggi (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/914,895

(22) Filed: Oct. 28, 2010

(65) Prior Publication Data

US 2012/0104624 A1 May 3, 2012

(51) Int. Cl.
*H01L 21/44* (2006.01)
*H01L 21/48* (2006.01)
*H01L 21/50* (2006.01)

(52) U.S. Cl. ................ 438/109; 257/E21.499
(58) Field of Classification Search .......... 438/109; 257/E21.499
See application file for complete search history.

(56) References Cited

U.S. PATENT DOCUMENTS

| | | | |
|---|---|---|---|
| 6,656,827 B1 * | 12/2003 | Tsao et al. | 438/612 |
| 6,861,761 B2 | 3/2005 | Yang et al. | |
| 7,034,388 B2 | 4/2006 | Yang et al. | |
| 7,198,980 B2 | 4/2007 | Jiang et al. | |
| 7,528,009 B2 | 5/2009 | Chen et al. | |
| 2007/0045875 A1 * | 3/2007 | Farnworth et al. | 257/787 |
| 2008/0272477 A1 | 11/2008 | Do et al. | |
| 2009/0091022 A1 | 4/2009 | Meyer et al. | |
| 2010/0327462 A1 * | 12/2010 | Farnworth et al. | 257/777 |

* cited by examiner

*Primary Examiner* — Alexander Ghyka
*Assistant Examiner* — Stanetta Isaac
(74) *Attorney, Agent, or Firm* — Robert D. Atkins; Patent Law Group: Atkins & Associates, P.C.

(57) ABSTRACT

A semiconductor wafer contains a plurality of first semiconductor die. The semiconductor wafer is mounted to a carrier. A channel is formed through the semiconductor wafer to separate the first semiconductor die. A second semiconductor die is mounted to the first semiconductor die. An encapsulant is deposited over the carrier and first semiconductor die and into the channel while a side portion and surface portion of the second semiconductor die remain exposed from the encapsulant. A first conductive via is formed through the encapsulant in the channel. A second conductive via is formed through the encapsulant over a contact pad of the first semiconductor die. A conductive layer is formed over the encapsulant between the first and second conductive vias. An insulating layer is formed over the conductive layer and encapsulant. The carrier is removed. An interconnect structure is formed over the first conductive via.

25 Claims, 12 Drawing Sheets

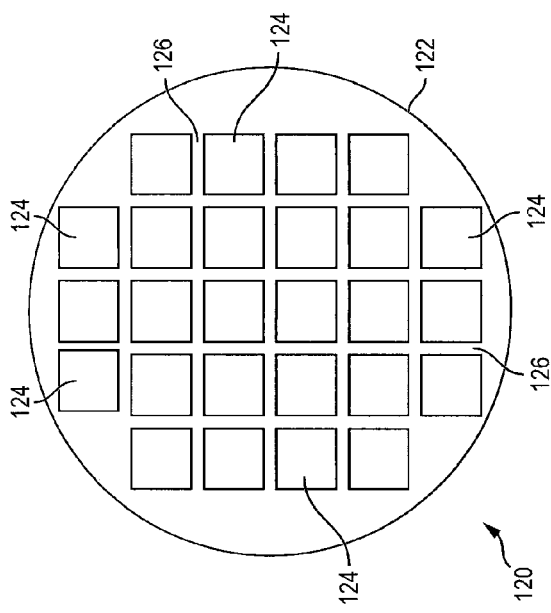
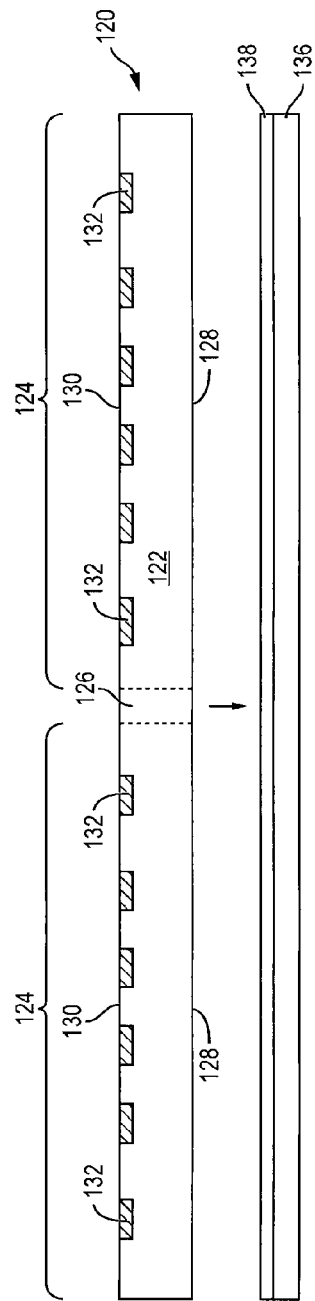
FIG. 3a
FIG. 3b

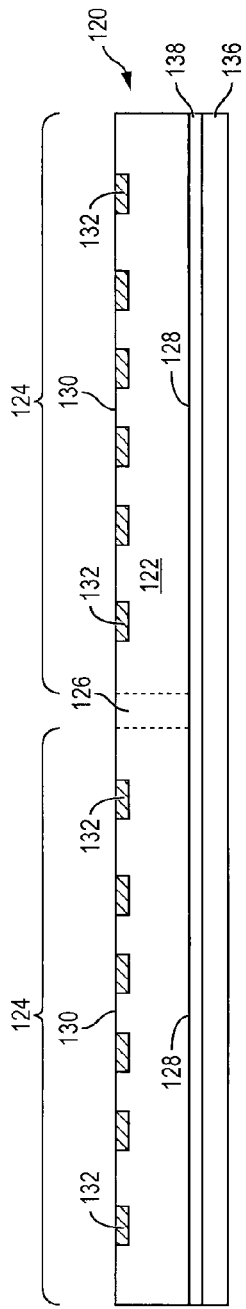
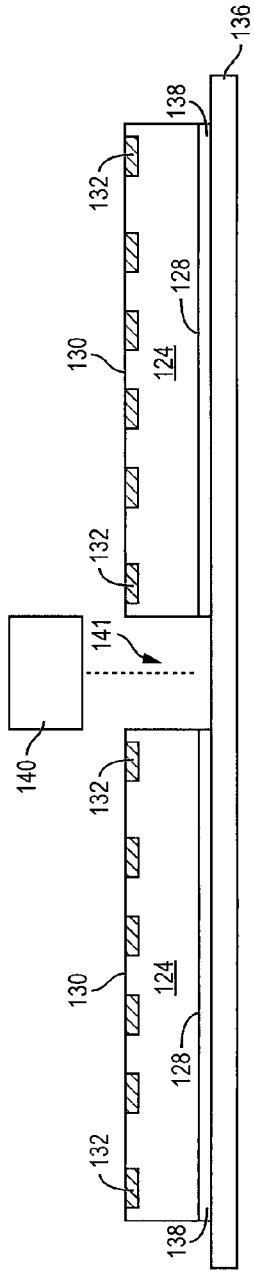
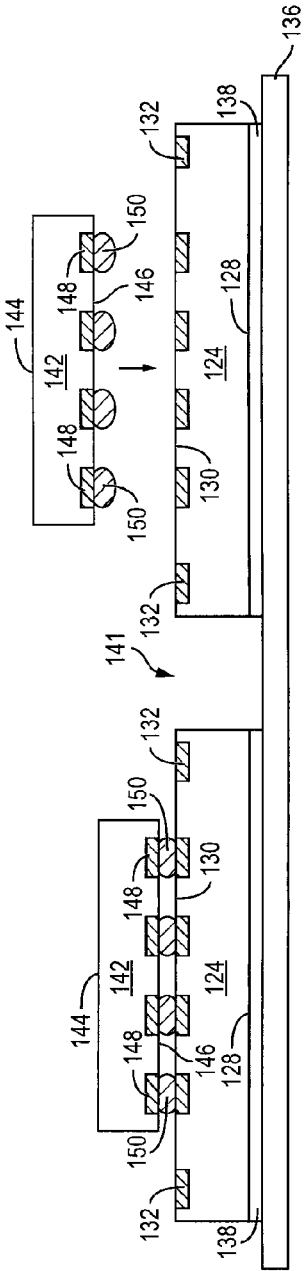
FIG. 3c
FIG. 3d
FIG. 3e

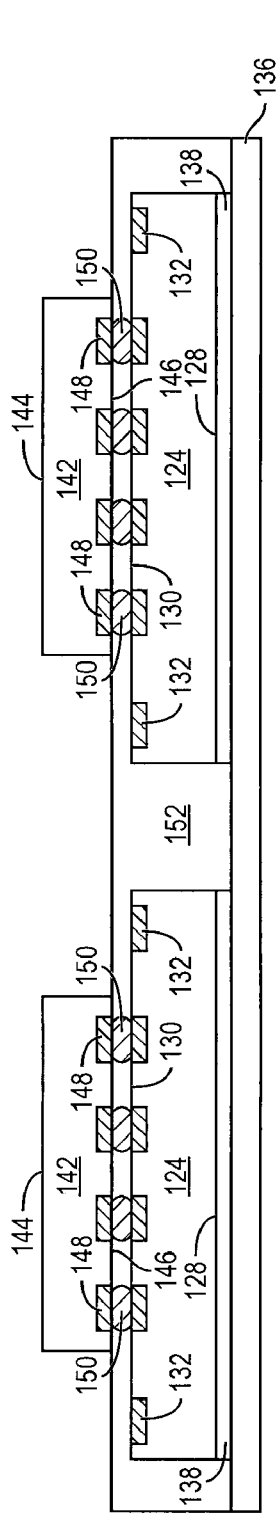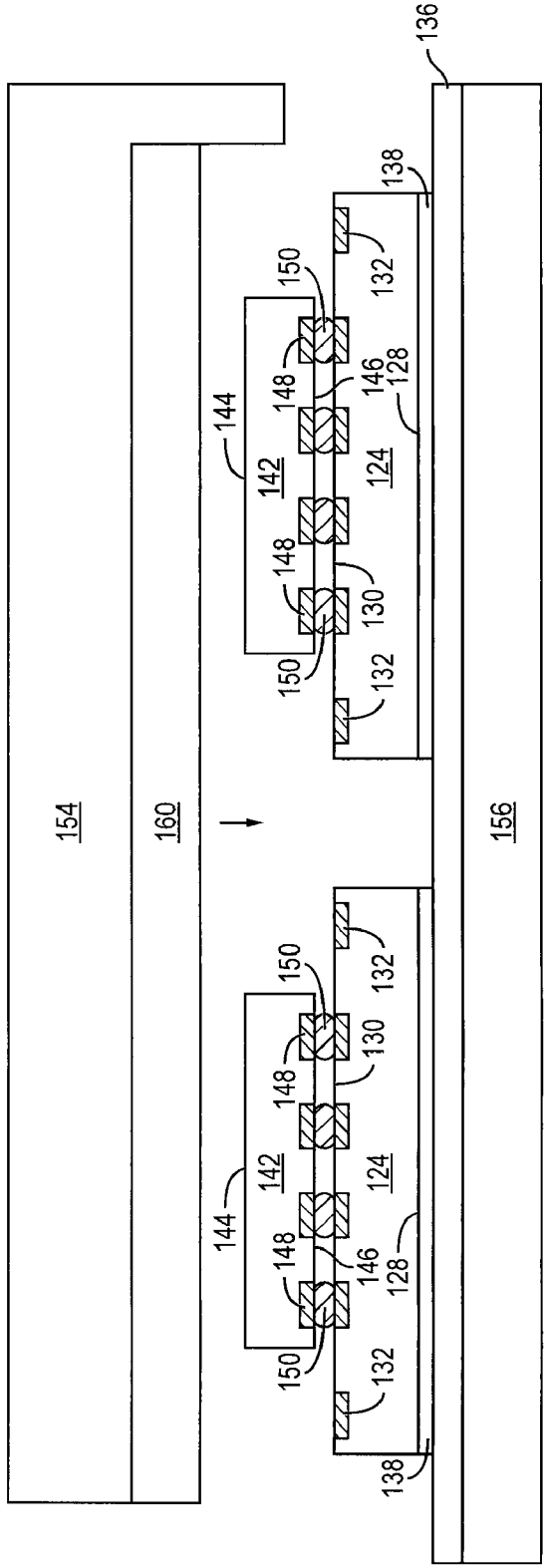

SEMICONDUCTOR DEVICE AND METHOD OF STACKING SEMICONDUCTOR DIE IN MOLD LASER PACKAGE INTERCONNECTED BY BUMPS AND CONDUCTIVE VIAS

FIELD OF THE INVENTION

The present invention relates in general to semiconductor devices and, more particularly, to a semiconductor device and method of stacking semiconductor die in a mold laser package electrically interconnected by bumps and conductive vias.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Most if not all wafer level chip scale packages (WLCSP) require a z-direction electrical interconnect structure for signal routing and package integration. Conventional WLCSP z-direction electrical interconnect structures exhibit one or more limitations. In one example, a conventional WLCSP contains a flipchip type semiconductor die and encapsulant formed over the die. An interconnect structure is typically formed over, around, and through the semiconductor die and encapsulant for z-direction vertical electrical interconnect. The flipchip semiconductor die is electrically connected to the interconnect structure with bumps. The encapsulant and bump interconnect makes package stacking difficult to achieve with fine pitch or high input/output (I/O) count electrical interconnect. In addition, wire bond type semiconductor die are also difficult to stack without dramatically increasing package height.

SUMMARY OF THE INVENTION

A need exists for a simple and cost effective WLCSP interconnect structure for applications requiring a fine interconnect pitch and vertical package integration. Accordingly, in one embodiment, the present invention is a method of making a semiconductor device comprising the steps of providing a semiconductor wafer containing a plurality of first semiconductor die, mounting the semiconductor wafer to a carrier, forming a channel through the semiconductor wafer to separate the first semiconductor die, mounting a second semiconductor die to the first semiconductor die, depositing an encapsulant over the carrier and first semiconductor die and into the channel while a side portion and surface portion of the second semiconductor die opposite the first semiconductor die remain exposed from the encapsulant, forming a conductive via through the encapsulant, forming a conductive layer over the encapsulant electrically connected to the conductive via, forming an insulating layer over the conductive layer and encapsulant, removing the carrier, and forming an interconnect structure over the conductive via.

In another embodiment, the present invention is a method of making a semiconductor device comprising the steps of providing a semiconductor wafer containing a plurality of first semiconductor die, mounting the semiconductor wafer to a carrier, forming a channel through the semiconductor wafer to separate the first semiconductor die, mounting a second semiconductor die to the first semiconductor die, depositing an encapsulant over the carrier and first semiconductor die and into the channel, forming a conductive via through the encapsulant, and forming a first conductive layer over the encapsulant electrically connected to the conductive via.

In another embodiment, the present invention is a method of making a semiconductor device comprising the steps of providing a first semiconductor die, mounting a second semiconductor die to the first semiconductor die, depositing a first encapsulant over and around the first semiconductor die, forming a first conductive via through the first encapsulant around the first semiconductor die, and forming a second conductive via through the first encapsulant over a contact pad of the first semiconductor die.

In another embodiment, the present invention is a semiconductor device comprising a first semiconductor die and second semiconductor die mounted to the first semiconductor die. An encapsulant is deposited over and around the first semiconductor die. A first conductive via is formed through the encapsulant around the first semiconductor die. A second conductive via is formed through the encapsulant over a contact pad of the first semiconductor die. A conductive layer is formed over the encapsulant between the first and second conductive vias.

DETAILED DESCRIPTION OF THE DRAWINGS

Figure 1:
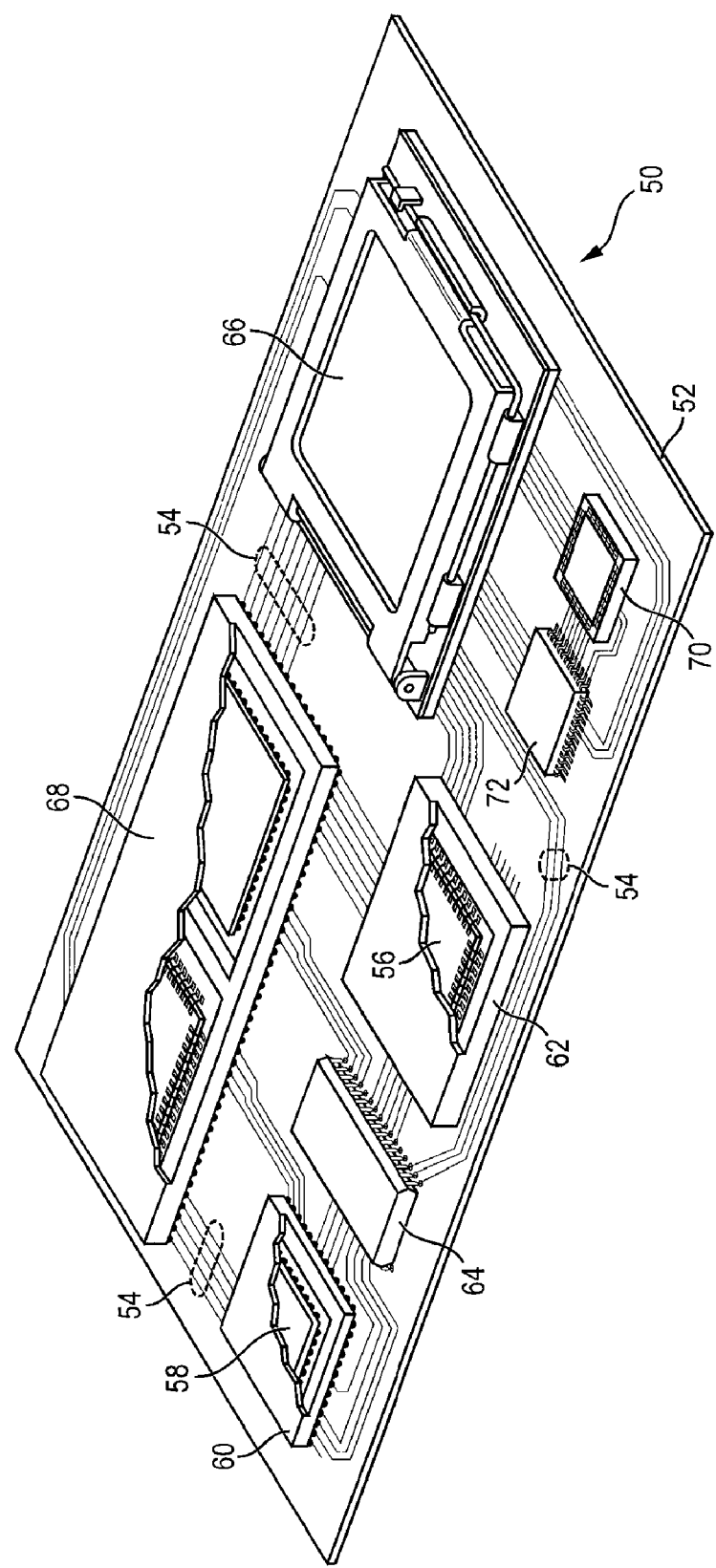
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
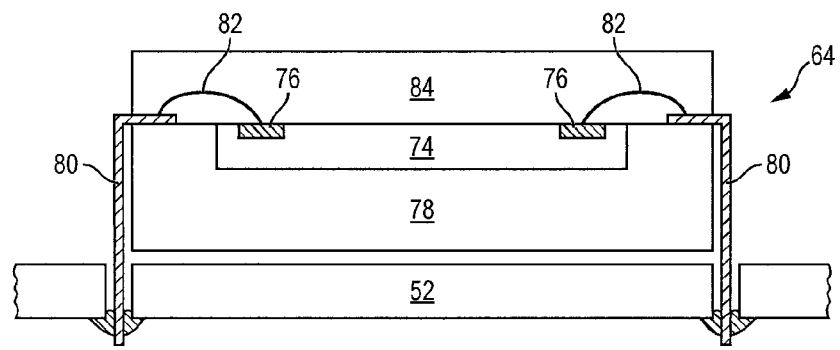
FIGS. 2a-2c illustrate further detail of the representative semiconductor packages mounted to the PCB.
Figure 2B:
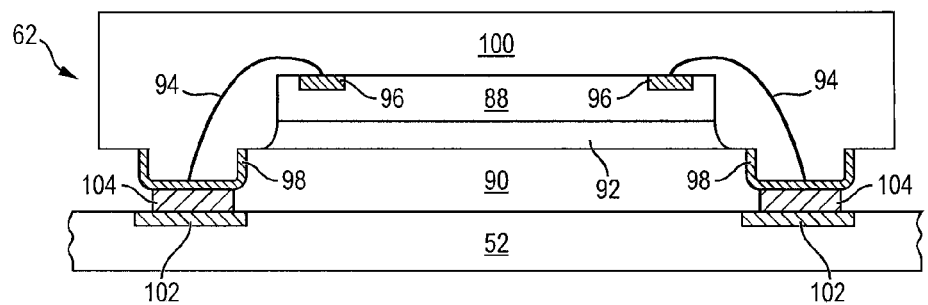
Figure 2C:
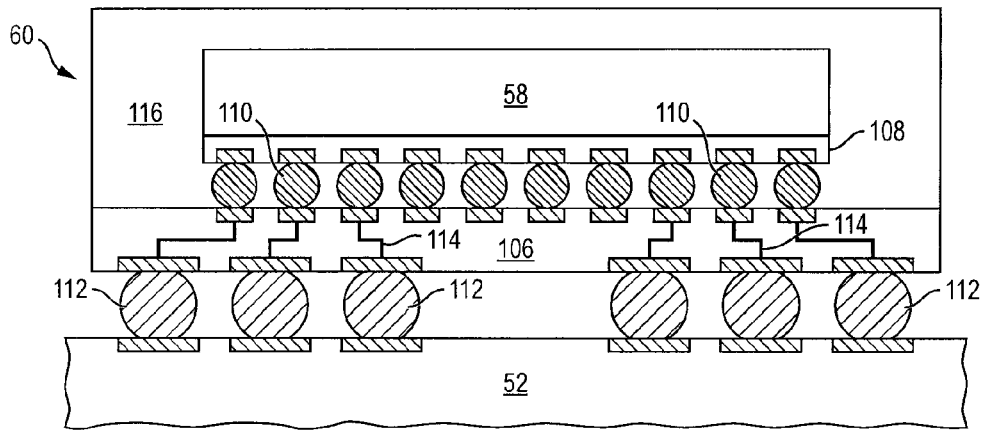

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3H:
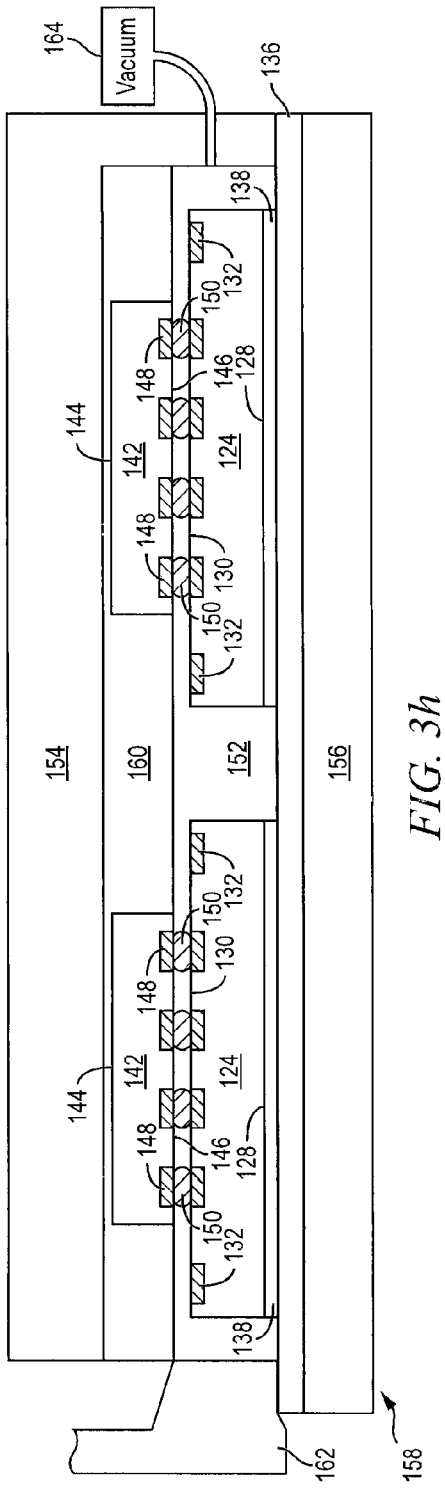
FIGS. 3a-3o illustrate a process of stacking semiconductor die in a mold laser package electrically interconnected by bumps and conductive vias.
Figure 3I:
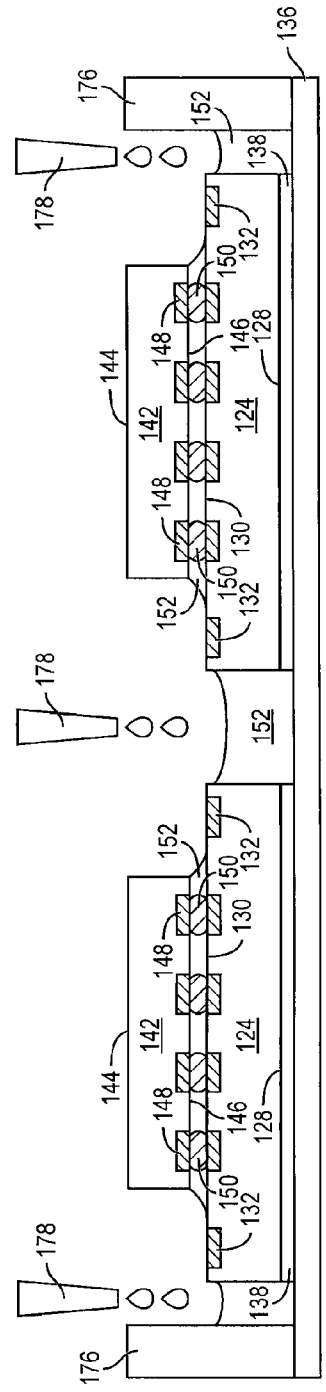
Figure 3J:
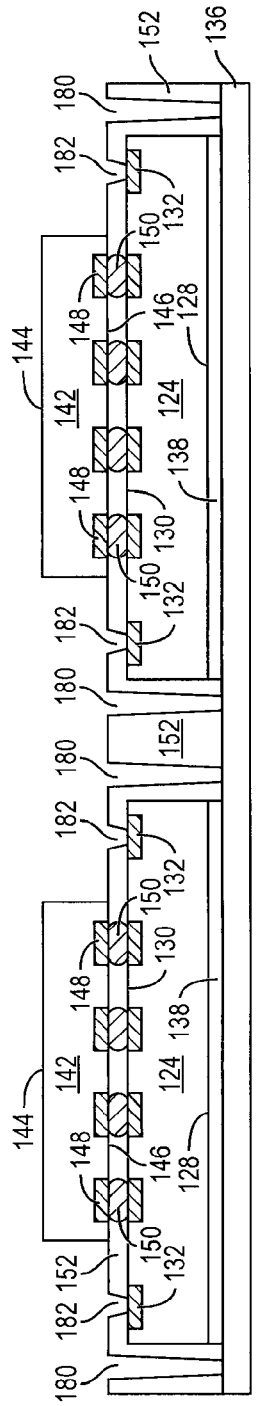
Figure 3K:
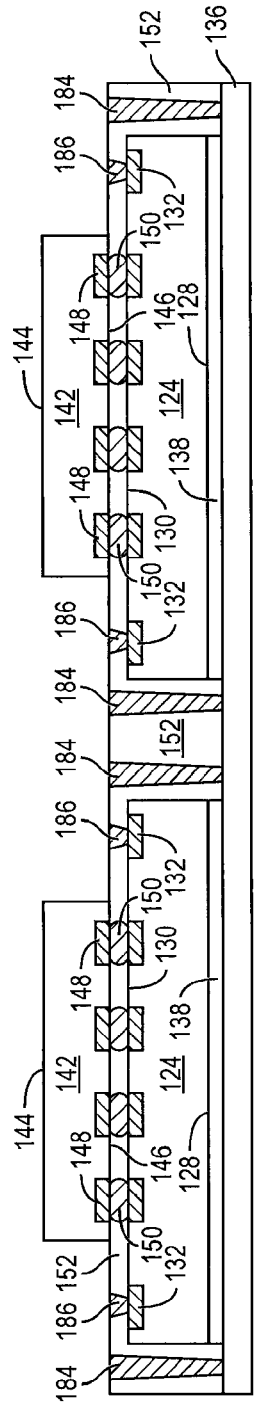
Figure 3L:
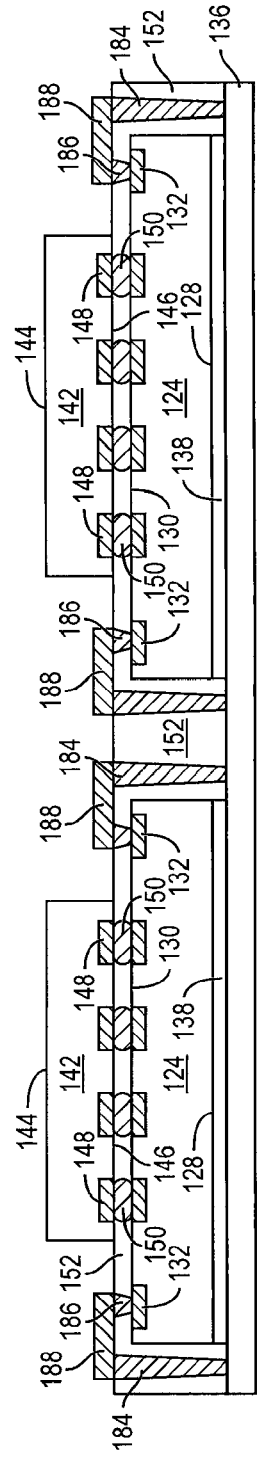
Figure 3M:
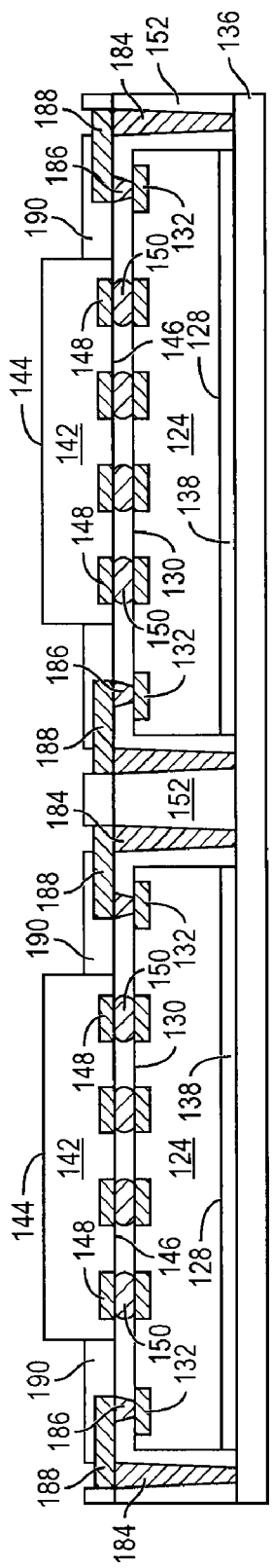
Figure 3N:
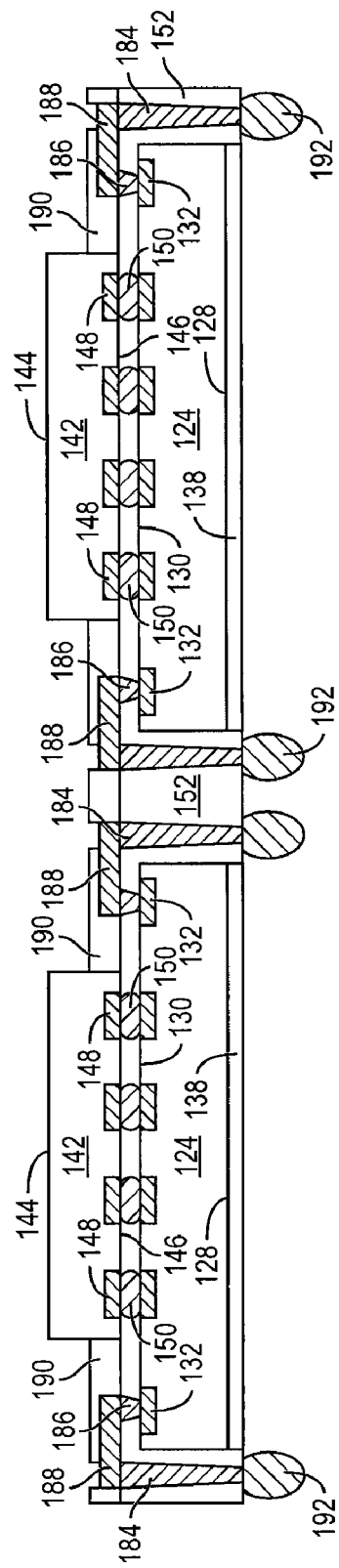
Figure 3O:
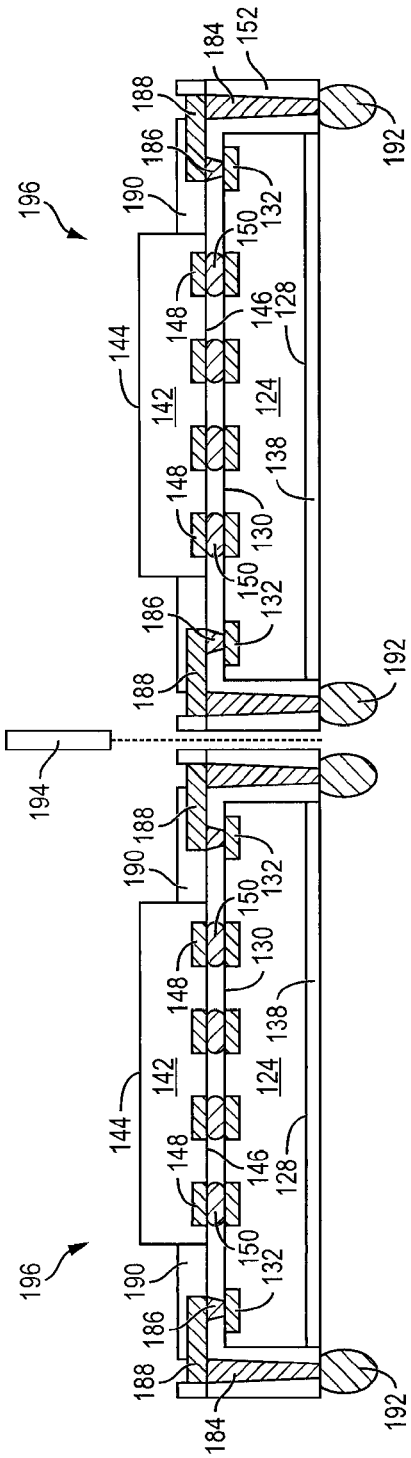

FIGS. 3a-3o illustrate, in relation to FIGS. 1 and 2a-2c, a process of stacking semiconductor die in a mold laser package electrically interconnected by bumps and conductive vias. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

A wafer-form substrate or carrier 136 contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer. Semiconductor wafer 120 is mounted back surface 128 to carrier 136 and interface layer 138, as shown in FIG. 3c.

In FIG. 3d, semiconductor wafer 120 is singulated through saw street 126 using a saw blade or laser cutting tool 140 to form channel 141 and separate the wafer into individual semiconductor die 124 which remain affixed to carrier 136 and interface layer 138. Channel 141 has sufficient width to contain multiple conductive vias.

FIG. 3e shows semiconductor die 142 having a back surface 144 and active surface 146 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 146 to implement analog circuits or digital circuits, such as DSP, ASIC, memory, or other signal processing circuit. Semiconductor die 142 may also contain IPDs, such as inductors, capacitors, and resistors, for RF signal processing. Contact pads 148 are formed over active surface 146 and bumps 150 are formed on the contact pads. In one embodiment, semiconductor die 142 is a flipchip type semiconductor die.

Semiconductor die 142 are mounted active surface 146 to active surface 130 of semiconductor die 124 using a pick and place operation. Bumps 150 of semiconductor die 142 are metallurgically and electrically connected to contact pads 132 of semiconductor die 124. Accordingly, the circuits on active surface 130 are electrically connected to the circuits on active surface 146 through the minimal electrical interconnect path of bumps 150.

In FIG. 3f, an encapsulant or molding compound 152 is formed around semiconductor die 124 and in the gap between semiconductor die 124 and 142 using a paste printing, compressive molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants. The back surface 144 and side surfaces of semiconductor die 142 remain exposed from encapsulant 152.

FIGS. 3g-3h show one embodiment of forming encapsulant 152 around semiconductor die 124 and in the gap between semiconductor die 124 and 142. Carrier 136 with semiconductor die 124 and 142 are placed between upper mold support 154 and lower mold support 156 of chase mold 158. The upper mold support 154 includes compressible releasing film 160. The upper mold support 154 and lower mold support 156 are brought together to enclose carrier 136 and semiconductor die 124 and 142 with an open space over carrier 136, around semiconductor die 124, and between semiconductor die 124 and 142. Compressible releasing film 160 conforms to back surface 144 and side surfaces of semiconductor die 142 to block formation of encapsulant on these surfaces.

In FIG. 3h, encapsulant 152 in a liquid state is injected into one side of chase mold 154 with nozzle 162 while vacuum assist 164 draws pressure from the opposite side to uniformly fill the open space around semiconductor die 124 and the open space between semiconductor die 124 and 142 with the encapsulant. Compressible material 160 prevents encapsulant 152 from flowing over back surface 144 and around the side surfaces of semiconductor die 142. After carrier 136 and semiconductor die 124 and 142 are removed from chase mold 158, encapsulant 152 has coverage as shown in FIG. 3f.

FIG. 3i shows another embodiment of depositing encapsulant 152 around semiconductor die 124 and in the gap between semiconductor die 124 and 142. Carrier 136 with semiconductor die 124 and 142 are placed within dam 176. Encapsulant 152 is dispensed from nozzles 178 in a liquid state into dam 176 to fill the open space around semiconductor die 124 and the open space between semiconductor die 124 and 142. The volume of encapsulant 152 dispensed from nozzles 178 is controlled to fill dam 176 without covering back surface 144 or the side surfaces of semiconductor die 142, as shown in FIG. 3f.

In FIG. 3j, after encapsulant 152 is cured, a plurality of vias 180 is formed through the encapsulant down to carrier 136 using laser drilling, mechanical drilling, or deep reactive ion etching (DRIE). The vias 180 can also be formed with a positive encapsulant-blocking via structure in the mold chase. Likewise, a plurality of vias 182 is formed through encapsulant 152 down to contact pads 132 of semiconductor die 124.

In FIG. 3k, vias 180 and 182 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive mold vias (TMV) or pillars 184 and 186, respectively.

In FIG. 3l, an electrically conductive layer 188 is formed over encapsulant 152 between conductive TMV 184 and 186 using a patterning and metal deposition process such as printing, PVD, CVD, sputtering, electrolytic plating, and electroless plating. Conductive layer 188 can be one or more layers of Al, Cu, Sn, Ni, Au, Ag, or other suitable electrically conductive material. Conductive layer 188 is electrically connected to conductive TMV 184 and 186.

In FIG. 3m, an insulating or passivation layer 190 is formed over encapsulant 152 and conductive layer 188 using PVD, CVD, printing, spin coating, spray coating, sintering or thermal oxidation. The insulating layer 190 contains one or more layers of silicon dioxide ($SiO_2$), silicon nitride ($Si_3N_4$), silicon oxynitride (SiON), tantalum pentoxide ($Ta_2O_5$), aluminum oxide (Al2O3), or other material having similar insulating and structural properties. A portion of insulating layer 190 is removed by an etching process to expose conductive layer 188.

In FIG. 3n, carrier 136 is removed by chemical etching, mechanical peeling, CMP, mechanical grinding, thermal bake, UV light, laser scanning, or wet stripping to expose encapsulant 152, interface layer 138 or semiconductor die 124, and conductive TMV 184.

An electrically conductive bump material is deposited over conductive TMV 184 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TMV 184 using a suitable attachment or bonding process. In one embodiment, the bump material is reflowed by heating the material above its melting point to form spherical balls or bumps 192. In some applications, bumps 192 are reflowed a second time to improve electrical contact to conductive TMV 184. The bumps can also be compression bonded to conductive TMV 184. Bumps 192 represent one type of interconnect structure that can be formed over conductive TMV 184. The interconnect structure can also use stud bump, micro bump, or other electrical interconnect.

Figure 4:
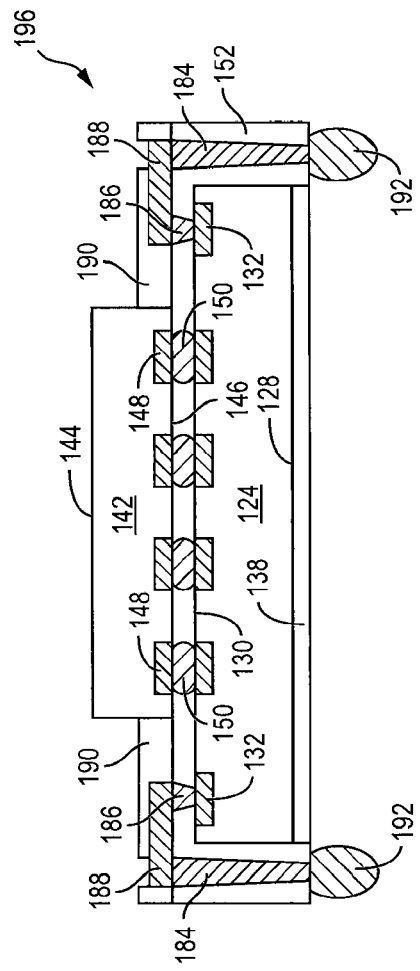
FIG. 4 illustrates the stacked semiconductor die in a mold laser package electrically interconnected by bumps and conductive vias.

In FIG. 3o, semiconductor die 124 and 142 are singulated through encapsulant 152 with saw blade or laser cutting tool 194 into individual WLCSP 196. FIG. 4 shows WLCSP 196 after singulation. Semiconductor die 124 is directly electrically connected to semiconductor die 142 through the minimal interconnect path of bumps 150. Semiconductor die 124 and 142 are electrically connected through conductive TMV 184 and 186, conductive layer 188, and bumps 192 to external devices. WLCSP 196 has a reduced profile in a molded laser package (MLP) with back surface 144 and a portion of the sides of semiconductor die 142 extending from encapsulant 152. The exposed semiconductor die 142 also enhances thermal dissipation. The electrical interconnection is accomplished using fine pitch bumps and conductive TMV for a high I/O count, without forming bond wires.

Figure 5:
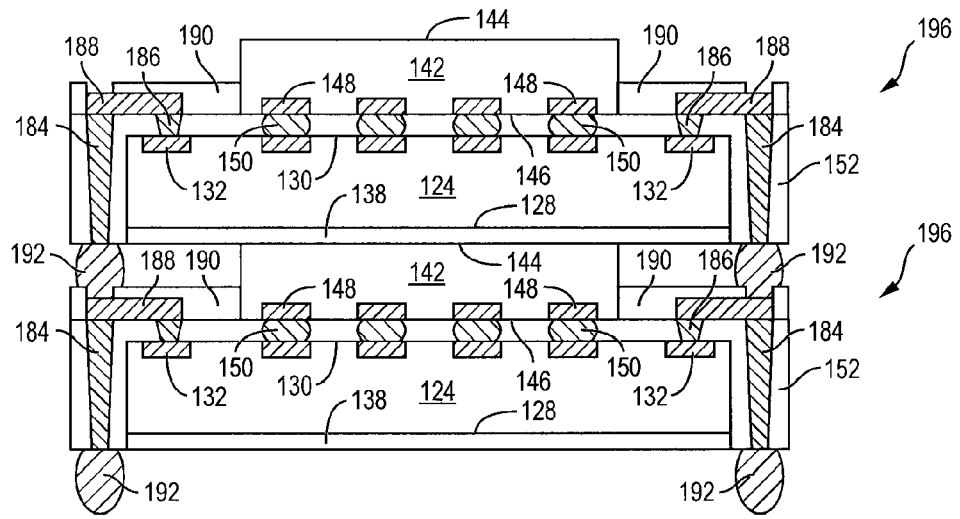
FIG. 5 illustrates stacking a plurality of WLCSP electrically interconnected by bumps and conductive vias.

FIG. 5 shows a plurality of stacked WLCSP 196 electrically connected through conductive layer 188, bumps 192, and conductive TMV 184 and 186.

Figure 6:
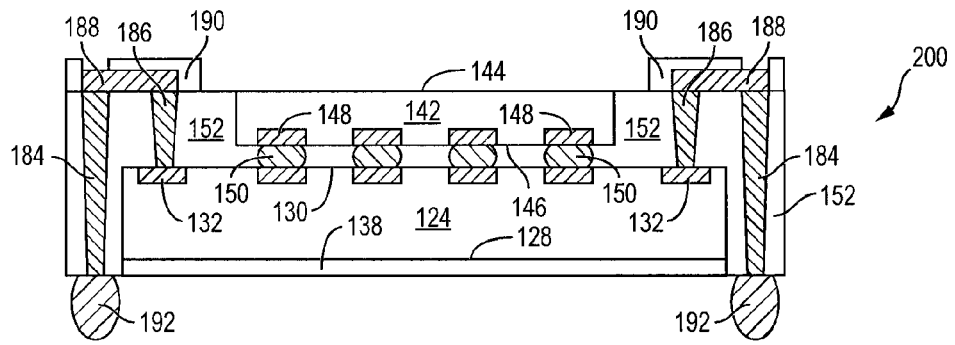
FIG. 6 illustrates the encapsulant co-planar with the upper semiconductor die in the WLCSP.

FIG. 6 shows an embodiment of WLCSP 200, similar to FIG. 4, with encapsulant 152 coplanar with back surface 144 of semiconductor die 142. Encapsulant 152 can be made coplanar with back surface 144 by omitting the compressible releasing film from the chase mold in FIGS. 3g-3h, or by additional filling of dam structure 176 in FIG. 3i.

Figure 7:
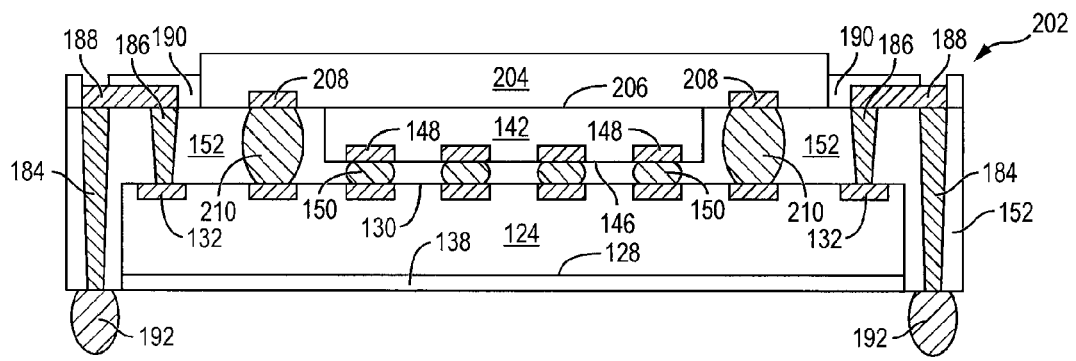
FIG. 7 illustrates a third semiconductor die mounted to the exposed semiconductor die in the WLCSP.

FIG. 7 shows an embodiment of WLCSP 202, similar to FIG. 6, with semiconductor die 204 mounted to back surface 144 of semiconductor die 142. Semiconductor die 204 has an active surface 206 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 206 to implement analog circuits or digital circuits, such as DSP, ASIC, memory, or other signal processing circuit. Semiconductor die 204 may also contain IPDs, such as inductors, capacitors, and resistors, for RF signal processing.

In one embodiment, semiconductor die 204 is a flipchip type semiconductor die. Contact pads 208 are formed over active surface 206. Semiconductor die 204 is mounted to semiconductor die 142 with bumps 210 formed between contact pads 208 and contact pads 132 prior to encapsulation. The stacked semiconductor die 124, 142, and 204 are encapsulated in the chase mold as described in FIGS. 3g-3h, or in the dam structure of FIG. 3i.

Figure 8:
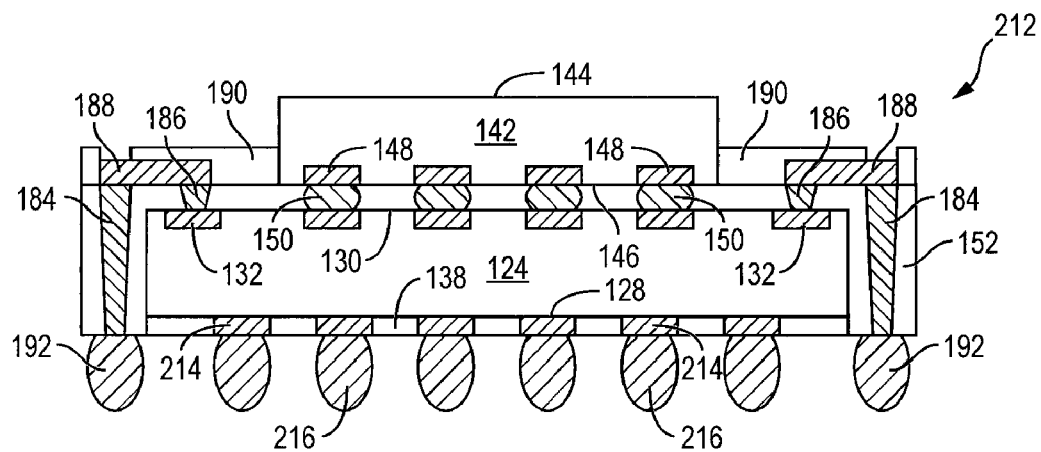
FIG. 8 illustrates an RDL formed over the lower semiconductor die in the WLCSP.

FIG. 8 shows an embodiment of WLCSP 212, similar to FIG. 4, with an electrically conductive layer or redistribution layer (RDL) 214 formed over back surface 128 of semiconductor die 124 using a patterning and metal deposition process such as printing, PVD, CVD, sputtering, electrolytic plating, and electroless plating. Conductive layer 214 can be one or more layers of Al, Cu, Sn, Ni, Au, Ag, or other suitable electrically conductive material. Bumps 216 are formed over conductive layer 214 for additional external electrical interconnect I/O count.

Figure 9:
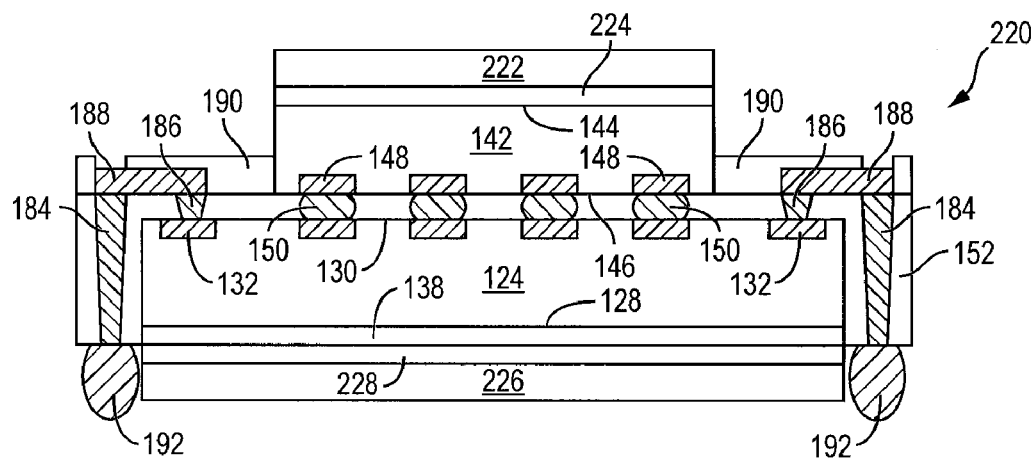
FIG. 9 illustrates a heat spreader mounted to the upper and lower semiconductor die in the WLCSP.

FIG. 9 shows an embodiment of WLCSP 220, similar to FIG. 4, with a heat sink or heat spreader 222 mounted to back surface 144 of semiconductor die 142 to dissipate thermal energy from the die. Heat spreader 222 can be Al, Cu, or another material with high thermal conductivity. An optional thermal interface material (TIM) 224 can be formed between back surface 144 and heat spreader 222. TIM 224 can be aluminum oxide, zinc oxide, boron nitride, or pulverized silver. TIM 224 aids in the distribution and dissipation of heat generated by semiconductor die 142.

A heat sink or heat spreader 226 is mounted to interface layer 138 or back surface 128 of semiconductor die 124 to dissipate thermal energy from the die. Heat spreader 226 can be Al, Cu, or another material with high thermal conductivity. An optional TIM 228 can be formed between back surface 128 and heat spreader 226. TIM 228 can be aluminum oxide, zinc oxide, boron nitride, or pulverized silver. TIM 228 aids in the distribution and dissipation of heat generated by semiconductor die 124.

Figure 10:
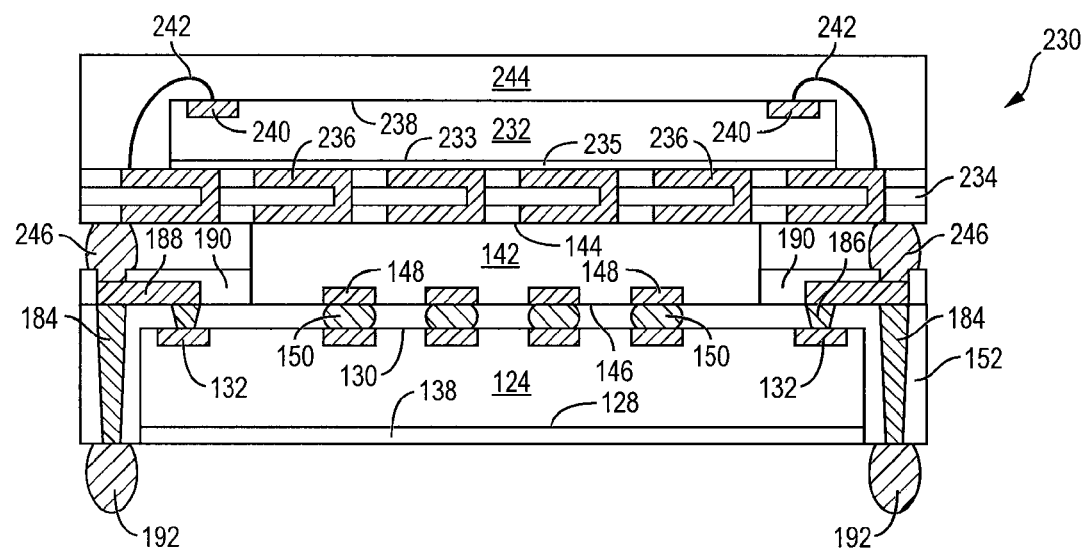
FIG. 10 illustrates a wire bond type semiconductor die and substrate mounted to the exposed semiconductor die.

FIG. 10 shows an embodiment of WLCSP 230, similar to FIG. 4, with semiconductor die 232 mounted back surface 233 to multi-layer substrate 234 with die attach adhesive 235. The multi-layer substrate 234 include conductive traces and vias 236 for electrical interconnect. Semiconductor die 232 has an active surface 238 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 238 to implement analog circuits or digital circuits, such as DSP, ASIC, memory, or other signal processing circuit. Semiconductor die 232 may also contain IPDs, such as inductors, capacitors, and resistors, for RF signal processing. In one embodiment, semiconductor die 232 is a wire bond type semiconductor die. Contact pads 240 are formed over active surface 238. Bond wires 242 are electrically connected between contact pads 240 and conductive traces and vias 236.

An encapsulant or molding compound 244 is deposited over semiconductor die 232 and substrate 234 using a paste printing, compressive molding, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants.

Bumps 246 are formed over conductive traces 236 and metallurgically and electrically connected to conductive layer 188. Semiconductor die 232 is thus electrically connected through bond wires 242, conductive traces and vias 236, bumps 246, conductive layer 188, and conductive TMV 184 and 186 to semiconductor die 124 and 142.

Figure 11:
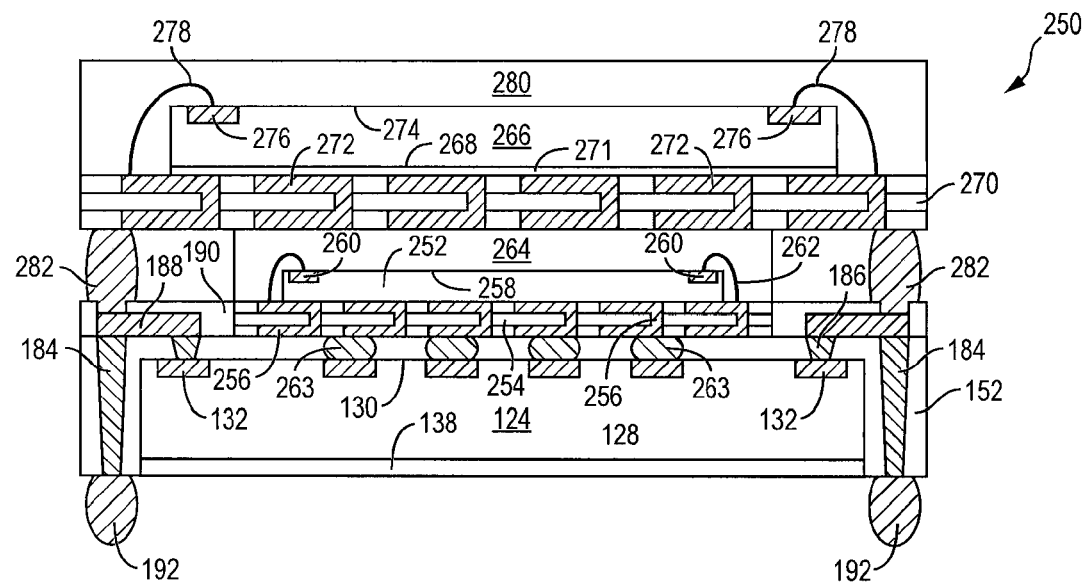
FIG. 11 illustrates two wire bond type semiconductor die and substrate mounted over the lower semiconductor die.

FIG. 11 shows an embodiment of WLCSP 250 with semiconductor die 252 and multi-layer substrate 254 disposed over semiconductor die 124. The multi-layer substrate 254 includes conductive traces and vias 256 for electrical interconnect. Semiconductor die 252 has an active surface 258 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 258 to implement analog circuits or digital circuits, such as DSP, ASIC, memory, or other signal processing circuit. Semiconductor die 252 may also contain IPDs, such as inductors, capacitors, and resistors, for RF signal processing. In one embodiment, semiconductor die 252 is a wire bond type semiconductor die. Contact pads 260 are formed over active surface 258. Bond wires 262 are electrically connected between contact pads 260 and conductive traces and vias 256. Conductive traces and vias 256 are electrically connected to contact pads 132 of semiconductor die 124 with bumps 263. Semiconductor die 252 is thus electrically connected through bond wires 262, conductive traces and vias 256, and bumps 263 to semiconductor die 124.

An encapsulant or molding compound 264 is deposited over semiconductor die 252 and substrate 254 using a paste printing, compressive molding, transfer molding, liquid encapsulant molding, vacuum lamination, spin coating, or other suitable applicator. Encapsulant 264 can be polymer composite material, such as epoxy resin with filler, epoxy acrylate with filler, or polymer with proper filler. Encapsulant 264 is non-conductive and environmentally protects the semiconductor device from external elements and contaminants.

Semiconductor die 266 is mounted back surface 268 to multi-layer substrate 270 with die attach adhesive 271. The multi-layer substrate 270 includes conductive traces and vias 272 for electrical interconnect. Semiconductor die 266 has an active surface 274 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 274 to implement analog circuits or digital circuits, such as DSP, ASIC, memory, or other signal processing circuit. Semiconductor die 266 may also contain IPDs, such as inductors, capacitors, and resistors, for RF signal processing. In one embodiment, semiconductor die 266 is a wire bond type semiconductor die. Contact pads 276 are formed over active surface 274. Bond wires 278 are electrically connected between contact pads 276 and conductive traces and vias 272.

An encapsulant or molding compound 280 is deposited over semiconductor die 266 and substrate 270 using a paste printing, compressive molding, transfer molding, liquid encapsulant molding, vacuum lamination, spin coating, or other suitable applicator. Encapsulant 280 can be polymer composite material, such as epoxy resin with filler, epoxy acrylate with filler, or polymer with proper filler. Encapsulant 280 is non-conductive and environmentally protects the semiconductor device from external elements and contaminants.

Bumps 282 are formed over conductive traces 272 and metallurgically and electrically connected to conductive layer 188. Semiconductor die 266 is thus electrically connected through bond wires 278, conductive traces and vias 272, bumps 282, conductive layer 188, and conductive TMV 184 and 186 to semiconductor die 124 and 252.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a semiconductor wafer containing a plurality of first semiconductor die;
   mounting the semiconductor wafer to a carrier;
   forming a channel through the semiconductor wafer to separate the first semiconductor die;
   mounting a second semiconductor die over the first semiconductor die with an active surface of the second semiconductor die oriented toward an active surface of the first semiconductor die;
   depositing an encapsulant over the carrier and first semiconductor die and into the channel while a side portion and surface portion of the second semiconductor die opposite the first semiconductor die remain exposed from the encapsulant;
   forming a conductive via through the encapsulant;
   forming a conductive layer over the encapsulant electrically connected to the conductive via;
   forming an insulating layer over the conductive layer and encapsulant;
   removing the carrier; and
   forming an interconnect structure over the conductive via.

2. The method of claim 1, wherein depositing the encapsulant over the carrier and first semiconductor die includes:
   disposing the carrier and first and second semiconductor die in a chase mold; and
   dispensing the encapsulant into the chase mold to cover the carrier and first semiconductor die while the side portion and surface portion of the second semiconductor die remain exposed from the encapsulant.

3. The method of claim 1, wherein depositing the encapsulant over the carrier and first semiconductor die includes:
   disposing the carrier and first and second semiconductor die in a chase mold;
   placing a mold film over the carrier and first and second semiconductor die; and
   compressing the chase mold to form the mold film over the carrier and first semiconductor die while the side portion and surface portion of the second semiconductor die remain exposed from the encapsulant.

4. The method of claim 1, wherein depositing the encapsulant over the carrier and first semiconductor die includes:
   forming a dam around the carrier and first and second semiconductor die; and
   dispensing the encapsulant into the dam to cover the carrier and first semiconductor die while the side portion and surface portion of the second semiconductor die remain exposed from the encapsulant.

5. The method of claim 1, further including mounting a third semiconductor die over the second semiconductor die.

6. The method of claim 1, further including singulating the first semiconductor die and second semiconductor die through the encapsulant.

7. A method of making a semiconductor device, comprising:
   providing a semiconductor wafer containing a plurality of first semiconductor die;

mounting the semiconductor wafer to a carrier;
forming a channel through the semiconductor wafer to separate the first semiconductor die;
mounting a second semiconductor die over the first semiconductor die with an active surface of the second semiconductor die oriented toward an active surface of the first semiconductor die;
depositing an encapsulant over the carrier and first semiconductor die and into the channel;
forming a conductive via through the encapsulant; and
forming a first conductive layer over the encapsulant electrically connected to the conductive via.

8. The method of claim 7, wherein depositing the encapsulant over the carrier and first semiconductor die includes:
disposing the carrier and first and second semiconductor die in a chase mold; and
dispensing the encapsulant into the chase mold to cover the carrier and first semiconductor die.

9. The method of claim 7, wherein depositing the encapsulant over the carrier and first semiconductor die includes:
disposing the carrier and first and second semiconductor die in a chase mold;
placing a mold film over the carrier and first and second semiconductor die; and
compressing the chase mold to form the mold film over the carrier and first semiconductor die.

10. The method of claim 7, wherein depositing the encapsulant over the carrier and first semiconductor die includes:
forming a dam around the carrier and first and second semiconductor die; and
dispensing the encapsulant into the dam to cover the carrier and first semiconductor die.

11. The method of claim 7, further including forming a heat spreader over the first semiconductor die or second semiconductor die.

12. The method of claim 7, further including depositing the encapsulant co-planar with a surface of the second semiconductor die opposite the first semiconductor die.

13. The method of claim 7, further including forming a second conductive layer over the first semiconductor die.

14. A method of making a semiconductor device, comprising:
providing a first semiconductor die;
mounting a second semiconductor die over the first semiconductor die with an active surface of the second semiconductor die oriented toward an active surface of the first semiconductor die;
depositing a first encapsulant over and around the first semiconductor die;
forming a first conductive via through the first encapsulant around the first semiconductor die; and
forming a second conductive via through the first encapsulant over a contact pad of the first semiconductor die.

15. The method of claim 14, further including:
forming a conductive layer over the first encapsulant between the first and second conductive vias; and
forming an insulating layer over the first encapsulant and conductive layer.

16. The method of claim 14, wherein a side portion and surface portion of the second semiconductor die opposite the first semiconductor die remain exposed from the first encapsulant.

17. The method of claim 14, wherein the first encapsulant is co-planar with a surface portion of the second semiconductor die opposite the first semiconductor die.

18. The method of claim 14, further including:
mounting a third semiconductor die to a substrate;
mounting the third semiconductor die and substrate to the second semiconductor die; and
depositing a second encapsulant over the third semiconductor die and substrate.

19. The method of claim 14, further including:
mounting the second semiconductor die to a substrate;
mounting the second semiconductor die and substrate to the first semiconductor die; and
depositing a second encapsulant over the second semiconductor die and substrate.

20. The method of claim 14, further including:
stacking a plurality of semiconductor devices; and
electrically connecting the stacked semiconductor devices through the first and second conductive vias.

21. A method of making a semiconductor device, comprising:
providing a first semiconductor die;
mounting a second semiconductor die over the first semiconductor die with an active surface of the second semiconductor die oriented toward an active surface of the first semiconductor die;
depositing a first encapsulant over and around the first semiconductor die; and
forming a first conductive via through the first encapsulant.

22. The method of claim 21, further including:
forming a second conductive via through the first encapsulant over a contact pad of the first semiconductor die;
forming a conductive layer over the first encapsulant between the first and second conductive vias; and
forming an insulating layer over the first encapsulant and conductive layer.

23. The method of claim 21, wherein a side portion and surface portion of the second semiconductor die opposite the first semiconductor die remain exposed from the first encapsulant.

24. The method of claim 21, wherein the first encapsulant is co-planar with a surface portion of the second semiconductor die opposite the first semiconductor die.

25. The method of claim 21, further including:
mounting a third semiconductor die to a substrate;
mounting the third semiconductor die and substrate to the second semiconductor die; and
depositing a second encapsulant over the third semiconductor die and substrate.

* * * * *